United States Patent
Choi et al.

(10) Patent No.: US 7,955,717 B2
(45) Date of Patent: Jun. 7, 2011

(54) ORGANIC ELECTROLUMINESCENT DEVICE AND METHOD OF PREPARING THE SAME

(75) Inventors: Dong-Soo Choi, Suwon-si (KR);
 Jang-Hyuk Kwon, Suwon-si (KR);
 Jin-Woo Park, Suwon-si (KR);
 Seung-Yong Song, Suwon-si (KR);
 Jong-Hyuk Lee, Suwon-si (KR);
 Yoon-Hyeung Cho, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1065 days.

(21) Appl. No.: 11/167,927

(22) Filed: Jun. 28, 2005

(65) Prior Publication Data
US 2006/0003139 A1 Jan. 5, 2006

(30) Foreign Application Priority Data
Jun. 29, 2004 (KR) .................. 10-2004-0049724

(51) Int. Cl.
 *H01L 51/54* (2006.01)
 *B05D 5/12* (2006.01)
(52) U.S. Cl. ........ 428/690; 428/917; 313/504; 313/506; 427/66
(58) Field of Classification Search .......... 427/66; 313/512, 506; 257/E51.02, E33.059
See application file for complete search history.

(56) References Cited

U.S. PATENT DOCUMENTS

| | | | | |
|---|---|---|---|---|
| 5,189,405 | A * | 2/1993 | Yamashita et al. | 313/512 |
| 6,432,516 | B1 * | 8/2002 | Terasaki et al. | 428/200 |
| 6,737,176 | B1 * | 5/2004 | Otsuki et al. | 428/690 |
| 6,882,104 | B2 * | 4/2005 | Miwa et al. | 313/506 |
| 7,077,935 | B2 * | 7/2006 | Ziegler et al. | 427/322 |
| 7,178,927 | B2 * | 2/2007 | Seo | 362/84 |
| 2001/0028218 | A1 * | 10/2001 | Mashiko et al. | 313/553 |
| 2005/0017633 | A1 * | 1/2005 | Miyadera | 313/512 |
| 2005/0174048 | A1 * | 8/2005 | Matsukaze | 313/512 |
| 2005/0224829 | A1 * | 10/2005 | Negley et al. | 257/E33.059 |
| 2005/0277355 | A1 * | 12/2005 | Choi et al. | 445/25 |

FOREIGN PATENT DOCUMENTS

| | | |
|---|---|---|
| CN | 1252757 | 5/2000 |
| CN | 1316870 | 10/2001 |
| JP | 09-148066 | 6/1997 |
| JP | 2000-173766 | 6/2000 |
| JP | 2001-035659 | 2/2001 |

(Continued)

OTHER PUBLICATIONS

Machine translation for JP 2004-335208, published Nov. 2004.*

(Continued)

*Primary Examiner* — Dawn L. Garrett
(74) *Attorney, Agent, or Firm* — Robert E. Bushnell, Esq.

(57) ABSTRACT

An organic electroluminescent device and a method of preparing the same are provided. The organic electroluminescent device includes a sealing layer which is formed on a sealing substrate, and which includes a cohesion layer, a transparent polymer layer, and a transparent moisture absorption layer. Since the transparent moisture absorption layer of the organic electroluminescent device is provided to a sealing substrate using an attaching method, the organic electroluminescent device has an improved life span property due to a firm sealed structure and better light extraction efficiency due to the transparent moisture absorption layer below the sealing substrate.

18 Claims, 3 Drawing Sheets

FOREIGN PATENT DOCUMENTS

| | | | |
|---|---|---|---|
| JP | 2002-216951 | | 8/2002 |
| JP | 2002-280166 | | 9/2002 |
| JP | 2003-217828 | | 7/2003 |
| JP | 2003-249349 | * | 9/2003 |
| JP | 2004-079208 | | 3/2004 |
| JP | 2004-095503 | * | 3/2004 |
| JP | 2004-335208 | * | 11/2004 |
| KR | 10-2001-0039723 | | 5/2001 |
| WO | WO 2004/008811 A1 | * | 1/2004 |

OTHER PUBLICATIONS

Machine translation for JP 2004-095503, published Mar. 2004.*

Machine translation of detailed description of JP 2004-335208 A (published Nov. 25, 2004).*

Korean Office Action of the Korean Patent Application No. 2004-49724, issued on Apr. 18, 2006.

Office Action from the Chinese Patent Office issued in Applicant's corresponding Chinese Patent Application No. 200510109836.6 dated Jul. 4, 2008.

Office Action from the Japanese Patent Office issued in Applicant's corresponding Japanese Patent Application No. 2005-190174 dated Aug. 26, 2008.

Office action from the Japanese Patent Office issued in Applicant's corresponding Japanese Patent Application No. 2005-190174 dated May 12, 2009.

* cited by examiner

INITIAL

AFTER 984 HOURS

ORGANIC ELECTROLUMINESCENT DEVICE AND METHOD OF PREPARING THE SAME

CLAIM OF PRIORITY

This application claims the priority of Korean Patent Application No. 10-2004-0049724, filed on Jun. 29, 2004, in the Korean Intellectual Property Office, the disclosure of which is incorporated herein in its entirety by reference.

BACKGROUND OF THE INVENTION

1. Field of the Invention

The present invention relates to an organic electroluminescent device and a method of preparing the same, and more particularly, to an organic electroluminescent device including a transparent moisture absorption layer formed using an attaching method and a method of preparing the electroluminescent device.

2. Description of the Related Art

A sealed structure is required to prevent deterioration of organic electroluminescent devices by permeation of moisture.

Conventionally, a metallic can or glass is processed in the form of a cap so as to have a groove, and a powder desiccant for absorbing moisture is placed in the groove.

However, the method of placing the desiccant includes complicated processes, and thus is very expensive. Also, the total thickness of substrates increases and a substrate used for sealing cannot be used for front light emission since it is not transparent. Additionally, although the metallic can is structurally firm, an etched glass is structurally weak. Thus, the etched glass can be easily impaired by an external impact.

Japanese Patent Laid-Open Publication No. Hei 9-148066 discloses an organic electroluminescent display device including a laminated body in which an organic luminescent material layer of an organic compound is placed between a pair of electrodes facing each other, an airtight container for shutting off the laminated body from the outside air, and a drying means, such as an alkali metal oxide or an alkali earth metal oxide, placed in the airtight container. This organic electroluminescent display device is thick due to the shape of the airtight container. Also, although the drying means maintains a solid state after adsorbing moisture, it cannot be applied to front light emission since it is opaque. Also, as stated above, since the method of placing the desiccant includes complicated processes, the manufacturing cost of the organic electroluminescent device is high.

To prepare a front light emission type organic electroluminescent device, it is very important to develop processing techniques for manufacturing a transparent sealing layer having moisture absorption property. Transparent sealing layers having moisture absorption property developed up to now are generally prepared by filling a liquid phase type transparent moisture absorption material in a glass cap and heat treating it to form a coating layer.

However, the side portions of the sealing layer may be contaminated during the process of applying the transparent moisture absorption material, and outgasing (e.g., outgasing of a solvent) may be caused during the process of heat treating the applied transparent moisture absorption material, thereby weakening a bonding force between a sealant and a sealing substrate. Thus, a firm sealed structure is not achieved, thereby fatally affecting a life span of the device.

SUMMARY OF THE INVENTION

It is therefore an object of the present invention to provide an improved organic electroluminescent device.

It is another object of the present invention to provide an improved method of preparing an organic electroluminescent device.

It is further an object of the present invention to provide an organic electroluminescent device having a firm sealed structure including a transparent moisture absorption layer, and a method of preparing the same.

According to an aspect of the present invention, there is provided an organic electroluminescent device including: a substrate; an organic electroluminescent unit formed on a surface of the substrate and including a first electrode layer, a second electrode layer, and an organic luminescent unit interposed between the first electrode layer and the second electrode layer; a sealing substrate joined with the substrate to seal the organic electroluminescent unit; and a sealing layer formed on a surface directing the organic electroluminescent unit of the sealing substrate and including a cohesion layer, a transparent polymer layer, and a transparent moisture absorption layer.

According to another aspect of the present invention, there is provided a method of preparing an organic electroluminescent device, the method including: forming a sealing layer composed of a cohesion layer, a transparent polymer layer, and a transparent moisture absorption layer; attaching the sealing layer to a sealing substrate; applying a sealant to at least one of the sealing substrate having the attached sealing layer and a substrate, on which an organic electroluminescent unit including a first electrode layer, a second electrode layer, and an organic luminescent unit interposed between the first electrode layer and the second electrode layer is formed; and joining the sealing substrate with the substrate having the formed organic electroluminescent unit.

The organic electroluminescent device of the present invention includes a transparent moisture absorption layer for achieving effective light extraction through a sealing substrate, but the transparent moisture absorption layer is provided to the sealing substrate using an attaching method so that a contamination of an end of the sealing substrate and outgasing of a solvent, which may occur during directly applying a transparent moisture absorption layer forming composition to the sealing substrate or during heat treating the applied transparent moisture absorption layer forming composition, do not occur. Thus, the organic electroluminescent device of the present invention has an improved life span due to a firm sealed structure, and can effectively achieve light extraction through the sealing substrate due to the transparent moisture absorption layer.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described in more detail.

Figure 1:
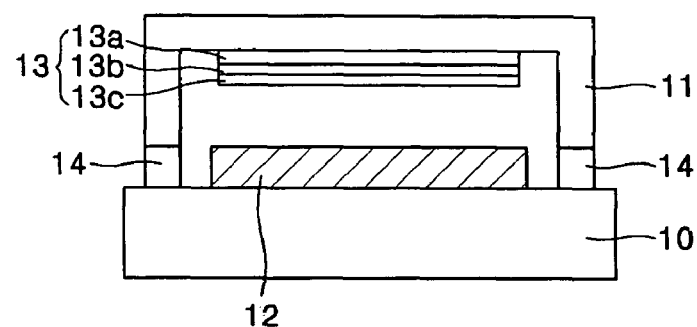
FIG. 1 schematically illustrates an organic electroluminescent device in cross section according to an embodiment of the present invention.

FIG. 1 schematically illustrates a cross-section of an organic electroluminescent device according to an embodiment of the present invention. In the organic electroluminescent device of the present invention, an organic electroluminescent unit 12 forming a display area is placed on a surface of a substrate 10. The organic electroluminescent unit 12 comprises a first electrode layer (not shown), a second electrode layer (not shown), and an organic luminescent unit (not shown) interposed between the first electrode layer and the second electrode layer. The organic luminescent unit includes an organic luminescent layer. A hole injecting layer and a hole transporting layer may be further included between the organic luminescent layer and the first electrode layer, and an electron transporting layer and an electron injecting layer may be further included between the organic luminescent layer and the second electrode layer. In addition, a TFT layer (not shown) including a driving thin film transistor, a switching thin film transistor, and the like may be further included between the organic electroluminescent unit 12 and the substrate 10. That is, the organic electroluminescent device according to an embodiment of the present invention may have a structure of an active matrix organic electroluminescent device as well as a passive matrix organic electroluminescent device.

The first electrode layer and the second electrode layer may be composed of various materials. Preferably, at least the second electrode layer may be composed of a transparent electrode layer, such as ITO or an ultrathin metal layer so as to bring about light extraction through a sealing substrate 11.

The sealing substrate 11 may be composed of a transparent material, for example, a glass material so as to bring about light extraction. A sealing layer 13 composed of a cohesion layer 13a, a transparent polymer layer 13b and a transparent moisture absorption layer 13c is formed on a surface, which faces the organic electroluminescent unit 12, of the sealing substrate 11.

First, the sealing layer 13 is attached to a surface of the sealing substrate 11 via the cohesion layer 13a. A material of the cohesion layer 13a is an adhesive usually used in the art, and examples thereof include acryl adhesives, vinyl adhesives, epoxy adhesives, urea adhesive, phenol adhesives, cresol adhesives, alkyd adhesives, chloroprene, styrene-butadiene rubber (SBR), carboxylmethyl cellulose, polyamide, and the like. Functional adhesives, for example, an instant adhesive, a hot melt adhesive, and a pressure sensitive adhesive (PSA), may also be used.

The acryl adhesive may be a polymer composed of at least one monomer selected from the group consisting of methylacrylate, methylmethacrylate, ethylacrylate, ethylmethacrylate, butylmethacrylate, cyclohexyl methacrylate, acrylonitrile, methacrylonitrile, vinylacetate, butylacrylate, 2-ethylhexylacrylate, hexylacrylate, propylacrylate, acrylic acid, methacrylic acid, crotonic acid, maleic acid, fumaric acid, and itaconic acid, but is not limited thereto. Examples of the acryl adhesive include, but are not limited to, cyanoacrylate, ethyleneglycol dimethacrylate, polyacrylate, polyacrylamide, and the like. Meanwhile, examples of the vinyl adhesive include, but are not limited to, polyvinylacetate, polyvinylphthyral, polyvinylether, polyvinylalcohol, and the like.

The transparent polymer layer 13b is placed below the transparent cohesion layer 13a of the sealing layer 13. A material of the transparent polymer layer 13b may be a material having better light transmission property considering light extraction through the sealing substrate 11. It should also have a chemical resistance considering contact with the transparent moisture absorption layer 13c and the cohesion layer 13a and have a heat resistance considering a heat treatment operation or a deposition operation when forming the transparent moisture absorption layer 13c. Examples of such a material include, but are not limited to, polyester polymers, polycarbonate polymers, polystyrene polymers, acryl polymers, epoxy polymers, and the like. Examples of the polymers include, but are not limited to, polyethyleneterephthalate, polybutyleneterephthalate, polydihydroxymethylcyclohexylterephthalate, cellulose ester, unsaturated polyester, aromatic polyester, polycarbonate, polystyrene, styrene-acrylonitrile copolymer, styrene-butadiene copolymer, acrylonitrile-butadiene-styrene terpolymer, polymethylmethacrylate, and a polymer composed of at least two monomers among monomers forming the above polymers. Polystyrene, polycarbonate, and polymethylmethacrylate are preferred. The transparent polymer layer 13b may be obtained by using a commercially available polymer film itself, or by curing, for example, epoxy monomer or oligomer.

The transparent moisture absorption layer 13c is placed below the transparent polymer layer 13b of the sealing layer 13. The transparent moisture absorption layer 13c absorbs moisture in a space formed by the sealing substrate 11 and the substrate 10.

An embodiment of the moisture absorption layer 13c may be composed of a transparent nanoporous membrane. The transparent nanoporous membrane should not form a hard agglomerate of solid phase particles, and the size of the solid phase particle should be in a range where Rayleigh scattering dose not occur in a dispersion-stabilized sol, thereby being transparent and having no haze. Herein, "Rayleigh scattering" refers to the phenomenon in which a coating film has bluish color in a black background due to scattering in a region of short wavelength. To attain this property of the coating film, an average diameter of porous particles forming the sol should be less than 100 nm, and preferably less than 70 nm, and more preferably 20-60 nm. An average diameter of a pore formed after coating should also be less than 100 nm, and preferably less than 70 nm, and more preferably 20-60 nm.

Nano-sized porous particles forming the transparent nanoporous membrane may be at least one selected from among an alkali metal oxide, an alkali earth metal oxide, a metal halide, a metal sulfate, and a metal perchlorate having an average particle diameter of 100 nm or less, particularly 20-100 nm.

Examples of the alkali metal oxide include $Li_2O$, $Na_2O$, and $K_2O$, and examples of the alkali earth metal oxide include BaO, CaO, and MgO. Examples of the metal sulfate include $Li_2SO_4$, $Na_2SO_4$, $CaSO_4$, $MgSO_4$, $COSO_4$, $Ga_2(SO_4)_3$, $Ti(SO_4)_2$, and $NiSO_4$. Examples of the metal halide include $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, and $MgI_2$, and examples of the metal perchlorate include $Ba(ClO_4)_2$ and $Mg(ClO_4)_2$.

A thickness of the transparent moisture absorption layer 13c may be in a range of 50-100 μm. When the thickness of the transparent moisture absorption layer 13c is less than 50 µm, the effect of absorbing moisture is not satisfactory, and when the thickness of the transparent moisture absorption layer 13c is greater than 100 µm, the manufacturing costs may increase.

The sealing layer 13 composed of the cohesion layer 13a, the transparent polymer layer 13b, and the transparent moisture absorption layer 13c as described above can achieve the light transmittance of 95% or greater. Thus, when light is extracted to the external of the sealing substrate 11, an organic electroluminescent device in which a decrease of the light extraction rate by the sealing layer 13 rarely occurs, can be obtained.

The sealing substrate 11 having the sealing layer 13 and the substrate 10 having the organic electroluminescent unit 12 are joined through a sealant 14 to provide a sealed structure.

The organic electroluminescent device of the present invention as described above may be formed by forming a sealing layer composed of a cohesion layer, a transparent polymer layer, and a transparent moisture absorption layer; attaching the sealing layer to a sealing substrate; applying a sealant to at least one of the sealing substrate having the attached sealing layer and a substrate, on which an organic electroluminescent unit including a first electrode layer, a second electrode layer, and an organic luminescent unit interposed between the first electrode layer and the second electrode layer is formed; and joining the sealing substrate with the substrate having the laminated organic electroluminescent unit.

The sealing layer may be formed by preparing the transparent polymer layer as described above, forming the transparent moisture absorption layer on a surface of the transparent polymer layer, and forming the cohesion layer on another surface of the transparent polymer layer.

According to an embodiment of the method of forming the transparent moisture absorption layer on a surface of the transparent polymer layer, a transparent moisture absorption layer forming composition is first provided in a sol state by mixing nano-sized porous particles with a solvent and optionally an acid.

The nano-sized porous particle contained in the transparent moisture absorption layer forming composition is the same as described above, and thus the detailed description thereof will be omitted. The solvent contained in the transparent moisture absorption layer forming composition is not limited as long as the porous particles may be dispersed therein, and examples thereof include ethanol, methanol, propanol, butanol, isopropanol, methylethylketone, pure water, propyleneglycol, (mono)methylether (PGM), isopropyl cellulose (IPC), methylene chloride (MC), ethylene carbonate (EC). The amount of the solvent is in a range of 60-99 parts by weight based on 100 parts by weight of the porous particles. The acid contained in the transparent moisture absorption layer forming composition is an optional component and its addition can improve dispersion. Examples of the acid include nitric acid, hydrochloric acid, sulfuric acid, acetic acid, and the like. The amount of the acid may be in a range of 0.01-0.1 part by weight based on 100 parts by weight of the porous particles.

The prepared transparent moisture absorption layer forming composition is applied to the transparent polymer layer through a spin-coating or a casting method. Thereafter, a heat treatment operation is performed to remove the solvent. A temperature, pressure, and time of the heat treatment operation may be easily controlled according to the type of a used solvent. For example, the heat treatment operation may be performed by drying the composition in a dry oven for about 2 minutes, and heating the resultant at 250° C. for 30 minutes.

According to another embodiment of the method of forming the transparent moisture absorption layer on a surface of the transparent polymer layer, a deposition method is used. A general deposition method, for example, a sputtering method, a vacuum heat deposition method, or the like may be used and the deposition condition should be controlled so as not to impair the transparent polymer layer during depositing it. To form the transparent moisture absorption layer as described above, an alkali metal or alkali earth metal powder is used as a deposition source. Examples of the alkali metal or alkali earth metal powder include Li, Na, K, Ba, Ca, Mg, Co, Ga, Ti, Ni, Sr, Y, Cu, Cs, Ta, Nb, Ce, Se, and V. Meanwhile, examples of gas for deposition include, but are not limited to, oxygen gas, halogen gas (for example, fluorine, chlorine, bromine, and iodine gas), and the like.

After forming the transparent moisture absorption layer on a surface of the transparent polymer layer as described above, the cohesion layer is formed on another surface of the transparent polymer layer. The cohesion layer is formed by applying the adhesive as described above on a surface of the transparent polymer layer. Thus, an attachable sealing layer composed of the cohesion layer, the transparent polymer layer, and the transparent moisture absorption layer may be formed.

Then, the attachable sealing layer is attached to a surface, which faces the organic electroluminescent unit, of the sealing substrate. The sealing substrate may be an etched glass cap. To attach the sealing layer to the sealing substrate, a predetermined process, such as pressurizing or heating, may be further included according to the type of adhesive forming the cohesion layer.

Subsequently, a sealant is applied to at least one of the sealing substrate and the substrate, on which the organic electroluminescent unit having the first electrode layer, the second electrode layer, and the organic luminescent unit between the first electrode layer and the second electrode layer is formed and the two substrate are joined. A thermosetting resin or a UV curable resin is used as the sealant and an unlimited example thereof includes epoxy resin. The joining process is performed by pressurizing under a decompression condition (for example, 600-650 torr).

Then, a first curing process is performed by irradiating UV onto the resultant, and then, a second curing (supplementary curing) process is performed so as to thermally cure the sealant by heating. The heating temperature is lower than 100° C., and preferably 60-80° C.

The present invention will now be described in greater detail with reference to the following examples. The following examples are for illustrative purposes and are not intended to limit the scope of the invention.

EXAMPLE 1

Nitric acid was first added to 95 g of ethanol to adjust pH to 2, and then 5 g of a CaO powder was placed therein, followed by stirring the mixture to prepare a mixture in a sol state.

The mixture in a sol state was applied to a polymethyl methacrylate film and spin-coated at 180 rpm for 120 seconds, and then dried in a dry oven for about 2 minutes so as to remove a solvent which was not evaporated. The resultant was heated in a vacuum oven at about 100° C. for 6 hours to form a transparent nanoporous CaO thin film (thickness: 50 µm).

An acryl adhesive was applied to another surface of the polymethyl methacrylate film to a thickness of 20 µm so as to form an attachable film type transparent CaO moisture absorption layer. Thereafter, the attachable film type transparent CaO moisture absorption layer was attached to an etched active area of a sealing substrate of soda glass.

Then, an epoxy resin, which was a sealant, was applied to at least one of the sealing substrate having the transparent CaO moisture absorption layer and a glass substrate on which a first electrode, an organic membrane, and a second electrode were formed. Subsequently, the pressure of the space between two substrates was reduced to about 600 torr and load of 3 kg was applied thereto. Then, a first curing process was performed by irradiating UV onto the resultant for 300 seconds.

Then, a second curing process was performed by heating the resultant at about 80° C. for 1 hour to obtain an organic electroluminescent device. This device was called "device 1".

EXAMPLE 2

First, a Ca deposition source was prepared with a Ca powder and a polymethyl methacrylate film was prepared as a transparent polymer layer. Then, a vacuum chamber having the Ca deposition source, a thermal evaporation source capable of accommodating the Ca deposition source thereon, a transparent polymer layer holder, and a rotation shaft for rotating the transparent polymer holder were prepared. Helisys (available from ANS) was used as the thermal evaporation source. The prepared transparent polymer layer was mounted on the holder located so as to face the Ca deposition source, and then the vacuum chamber was operated under the conditions shown in Table 1 to form a CaO layer with a thickness of 50 μm on a surface of the transparent polymer layer.

TABLE 1

| | |
|---|---|
| Basic pressure | $1.0 \times 10^{-7}$ Torr |
| Flow rate of gas | Flow rate of oxygen - 2 sccm |
| Thermal evaporation source | Tungsten boat |
| Thermal evaporation source operating condition | 200 A |
| Deposition angle | 90° |
| Substrate RPM | 4.5 |
| Substrate temperature | 80° C. |
| Deposition rate | 5 Å/sec |

An acryl adhesive was applied to another surface of the polymethyl methacrylate film having the CaO thin layer formed thereon to a thickness of 20 μm so as to form an attachable film type transparent CaO moisture absorption layer. Thereafter, the attachable film type transparent CaO moisture absorption layer was attached to an etched active area of a sealing substrate of soda glass.

Then, an epoxy resin, which was a sealant, was applied to at least one of the sealing substrate having the transparent CaO moisture absorption layer and a glass substrate on which a first electrode, an organic membrane, and a second electrode were formed. Subsequently, the pressure of the space between two substrates was reduced to about 600 torr and load of 3 kg was applied thereto. Then, a first curing process was performed by irradiating UV light onto the resultant for 300 seconds.

Then, a second curing process was performed by heating the resultant at about 80° C. for 1 hour to obtain an organic electroluminescent device. This device was called "device 2".

EXPERIMENTAL EXAMPLE 1

Evaluation of Light Transmittance

The devices 1 and 2 were operated and the light transmittance through the sealing substrate was evaluated. The light transmittance was measured by operating the devices on MCPD7000 (PHOTAL, available from Otsuka Electronics). As a result, both of the devices 1 and 2 showed a light transmittance of 95% or greater.

EXPERIMENTAL EXAMPLE 2

Evaluation of Luminance

Figure 2:
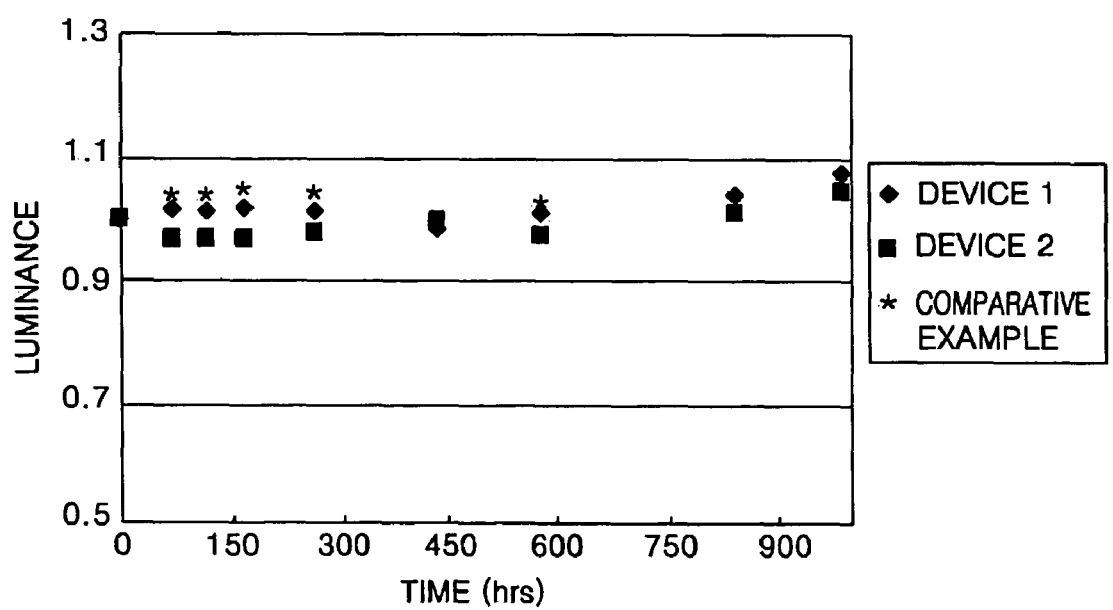
FIG. 2 is a graph illustrating life spans of organic electroluminescent devices according to an embodiment of the present invention and a conventional organic electroluminescent device.

The luminance properties of the devices 1 and 2 were evaluated. FIG. 2 is a graph showing variations in luminance depending on time of the devices 1 and 2. In FIG. 2, luminance of a conventional organic electroluminescent device having a rear light emitting getter is shown as Comparative Example. The devices 1 and 2 do not show a reduction of luminance even after 900 hours, whereas the Comparative Example shows a reduction by half of luminance even after 600 hours. Thus, it can be seen that the devices 1 and 2 according to the present invention have luminance stability, since a reduction of luminance is not observed even after a long period of time.

EXPERIMENTAL EXAMPLE 3

Evaluation of Life Span

Figure 3A:
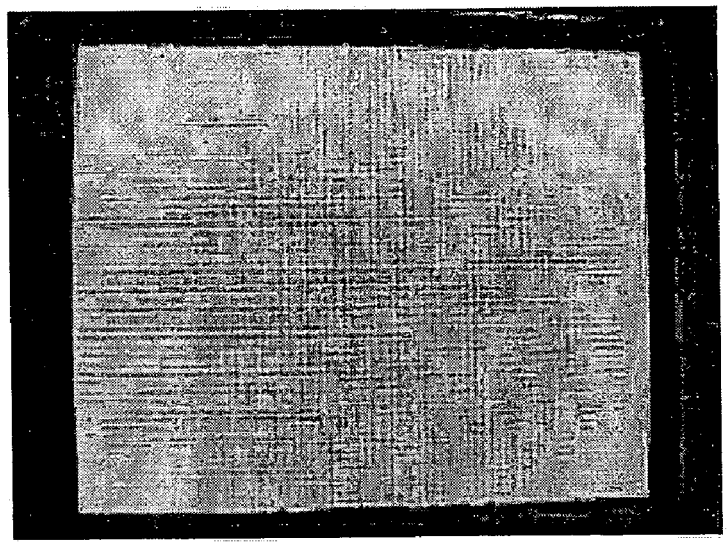
FIGS. 3A and 3B show photographs illustrating luminance of an organic electroluminescent device according to an embodiment of the present invention.
Figure 3B:
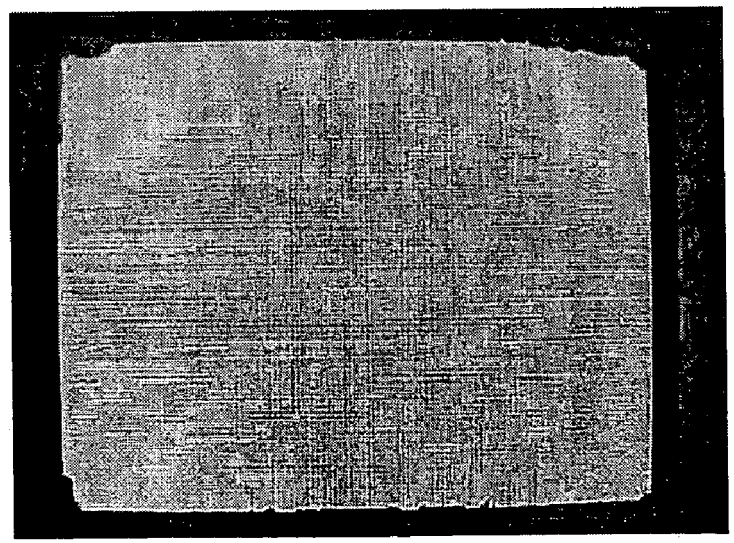
Figure 4:
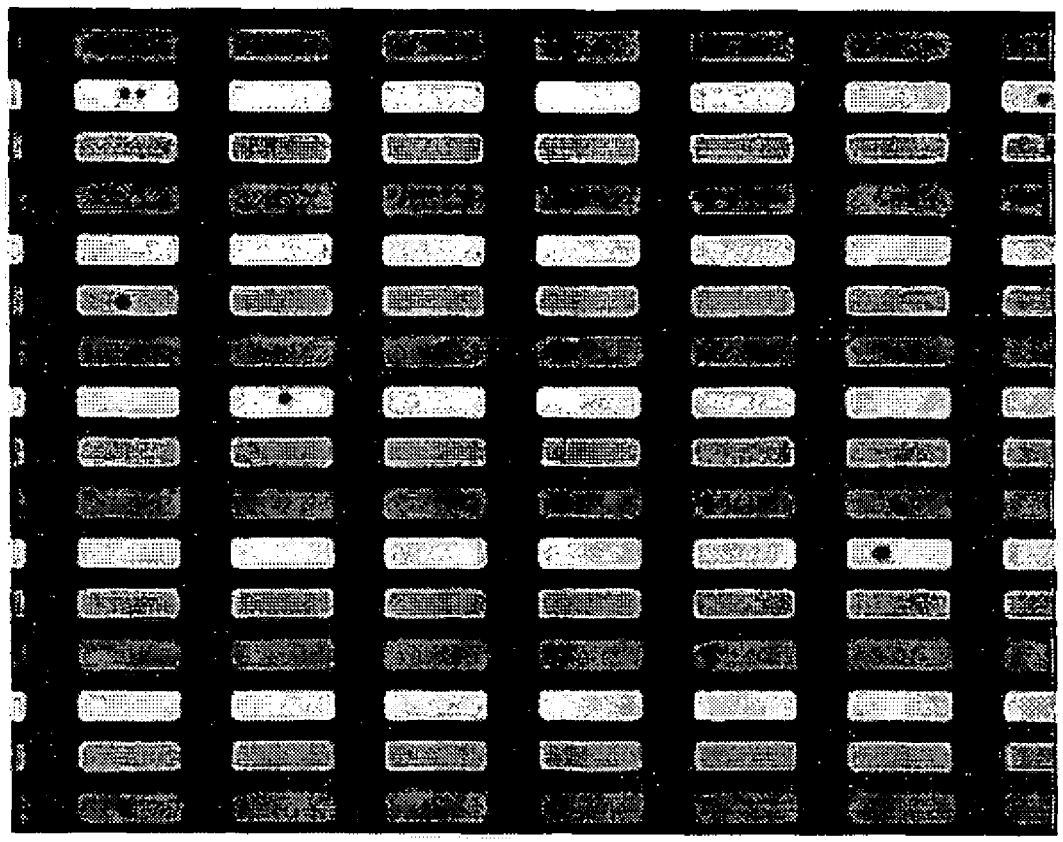
FIG. 4 is a pixel image after operating an organic electroluminescent device according to an embodiment of the present invention for 984 hours.

The life span of the device 1 was evaluated. The life span was determined by evaluating an occurrence of dark spots after leaving the device 1 at 70° C. and humidity of 90%. FIG. 3A is an initial photograph of the device 1 and FIG. 3B is a photograph of the device 1 after evaluating the life span for 984 hours. FIG. 4 illustrates a pixel image of the device 1 after 984 hours. Referring to FIG. 3B, novel dark spots are generated in an extremely small amount in the device 1 even after 984 hours. Also, it can be seen that the generated dark spots have very small sizes of 10 μm or less. This result can be seen from FIG. 4 illustrating a pixel image of the device 1 after 984 hours. Thus, it can be seen that the moisture absorption layer of the device 1 according to the present invention has better moisture absorption ability even after a long period of time, and thus an organic electroluminescent device using the same has long life span.

A transparent moisture absorption layer of an organic electroluminescent device of the present invention is provided to a sealing substrate using an attaching method so that a contamination of an end portion of the sealing substrate and an outgasing phenomenon, which may occur when directly applying the transparent moisture absorption layer to the sealing substrate, are prevented. Thus, an organic electroluminescent device has an improved life span property due to an improved sealed structure, and better light extraction efficiency through a sealing substrate can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent device, comprising:
   a substrate;
   an organic electroluminescent unit formed on the substrate, the organic electroluminescent unit comprising a first electrode, a second electrode and an organic luminescent unit interposed between the first electrode and the second electrode;
   a sealant directly formed on the substrate;

a sealing substrate covering the organic electroluminescent unit, the sealing substrate contacting the sealant; and a sealing layer formed on the sealing substrate, the sealing layer comprising a cohesion layer attached to the sealing substrate, a transparent polymer layer formed on the cohesion layer, and a transparent moisture absorption layer formed on the transparent polymer layer to absorb moisture in a sealed space formed by joining the sealing substrate with the substrate, the sealing layer preventing Rayleigh scattering, the transparent moisture absorption layer comprising nano-sized porous particles and pores, an average diameter of the pores being less than 100 nm, the pores being formed between the nano-sized porous particles.

2. The organic electroluminescent device of claim 1, wherein the cohesion layer comprises an acryl adhesive.

3. The organic electroluminescent device of claim 1, wherein the transparent polymer layer comprises one selected from the group consisting of a polyester polymer, a polycarbonate polymer, a polystyrene polymer and an acryl polymer.

4. The organic electroluminescent device of claim 1, wherein the nano-sized porous particles are at least one selected from the group consisting of alkali metal oxides, alkali earth metal oxides, metal halides, metal sulfates, and metal perchlorates.

5. The organic electroluminescent device of claim 1, wherein the nano-sized porous particles have an average particle diameter of 100 nm or less.

6. A method of preparing an organic electroluminescent device, the method comprising:

providing a sealing substrate;

forming a sealing layer comprising a cohesion layer attached to the sealing substrate, a transparent polymer layer formed on the cohesion layer, and a transparent moisture absorption layer formed on the transparent polymer layer, the sealing layer preventing Rayleigh scattering, the transparent moisture absorption layer comprising nano-sized porous particles and pores, an average diameter of the pores being less than 100 nm, the pores being formed between the nano-sized porous particles;

attaching the sealing layer to the sealing substrate;

preparing a substrate on which an organic electroluminescent unit is formed, the organic electroluminescent unit comprising a first electrode, a second electrode and an organic luminescent unit interposed between the first electrode and the second electrode;

applying a sealant to at least one of the sealing substrate and the substrate; and joining the sealing substrate with the substrate via the sealant to form a sealed space in which the organic luminescent unit and the sealing layer are positioned, the sealing layer attached to the sealing substrate, the sealing substrate covering the organic electroluminescent unit, the sealing substrate contacting the sealant, a portion of the sealed space being empty, the transparent polymer layer absorbing moisture in the sealed space.

7. The method of claim 6, wherein the forming of the sealing layer comprises:

providing the transparent polymer layer;

forming the transparent moisture absorption layer on one surface of the transparent polymer layer; and forming the cohesion layer on the other surface of the transparent polymer layer.

8. The method of claim 7, wherein the forming of the transparent moisture absorption layer comprises:

mixing nano-sized porous particles with a solvent and optionally an acid to form a composition in a sol state;

applying the composition to the transparent polymer layer; and heat-treating the composition applied to the transparent polymer layer.

9. The method of claim 8, wherein the nano-sized porous particles are at least one selected from the group consisting of alkali metal oxides, alkali earth metal oxides, metal halides, metal sulfates, and metal perchlorates.

10. The method of claim 8, wherein the nano-sized porous particles have an average particle diameter of 100 nm or less.

11. The method of claim 8, wherein the solvent is at least one selected from the group consisting of ethanol, methanol, propanol, butanol, isopropanol, methylethylketone, pure water, propyleneglycole, (mono)methylether (PGM), isopropyl cellulose (IPC), methylene chloride (MC), and ethylene carbonate (EC).

12. The method of claim 8, wherein the acid is at least one selected from the group consisting of nitric acid, hydrochloric acid, sulfuric acid, and acetic acid.

13. The method of claim 8, wherein the composition in the sol state contains 60-99 parts by weight of the solvent based on 100 parts by weight of the nano-sized porous particles and 0.01-0.1 part by weight of the acid based on 100 parts by weight of the nano-sized porous particles.

14. The method of claim 7, wherein the forming of the transparent moisture absorption layer is performed using a deposition method.

15. The method of claim 6, wherein the sealant is a thermosetting resin or a UV curable resin.

16. The method of claim 6, wherein the joining of the sealing substrate with the substrate comprises:

reducing a pressure of the sealed space;

first curing the sealant by irradiating a UV light; and second curing the sealant by a thermal curing process.

17. An organic electroluminescent device prepared by the method of claim 6.

18. An organic electroluminescent device, comprising:

a substrate on which an organic electroluminescent unit is formed, the organic electroluminescent unit comprising a first electrode, a second electrode and an organic luminescent unit interposed between the first electrode and the second electrode;

a sealing substrate joined with the substrate via a sealant to produce a sealed space in which the organic luminescent unit is positioned; and a sealing layer positioned inside the sealed space and attached to the sealing substrate, the sealing layer comprising a cohesion layer attached to the sealing substrate, a transparent polymer layer and a transparent moisture absorption layer to absorb moisture in the sealed space, a portion of the sealed space being empty, the sealing layer preventing Rayleigh scattering, the transparent moisture absorption layer comprising nano-sized porous particles and pores, an average diameter of the pores being less than 100 nm, the pores being formed between the nano-sized porous particles.

* * * * *